United States Patent
Liao et al.

(10) Patent No.: US 11,508,817 B2
(45) Date of Patent: Nov. 22, 2022

(54) PASSIVATION LAYER FOR EPITAXIAL SEMICONDUCTOR PROCESS

(71) Applicant: Taiwan Semiconductor Manufacturing Co., Ltd., Hsin-Chu (TW)

(72) Inventors: Yin-Kai Liao, Taipei (TW); Sin-Yi Jiang, Hsinchu (TW); Hsiang-Lin Chen, Hsinchu (TW); Yi-Shin Chu, Hsinchu (TW); Po-Chun Liu, Hsinchu (TW); Kuan-Chieh Huang, Hsinchu (TW); Jyh-Ming Hung, Dacun Township (TW); Jen-Cheng Liu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/036,287

(22) Filed: Sep. 29, 2020

(65) Prior Publication Data

US 2021/0376086 A1    Dec. 2, 2021

Related U.S. Application Data

(60) Provisional application No. 63/030,980, filed on May 28, 2020.

(51) Int. Cl.
  *H01L 29/10* (2006.01)
  *H01L 29/49* (2006.01)
  (Continued)

(52) U.S. Cl.
  CPC ........ *H01L 29/1087* (2013.01); *H01L 29/167* (2013.01); *H01L 29/4933* (2013.01); *H01L 29/6659* (2013.01)

(58) Field of Classification Search
  CPC .............. H01L 29/1087; H01L 29/167; H01L 29/4933; H01L 29/6659; H01L 31/02161;
  (Continued)

(56) References Cited

U.S. PATENT DOCUMENTS 9,165,839 B2 * 10/2015 Wong ................ H01L 21/30612
2004/0262635 A1 * 12/2004 Lee ................... H01L 29/78642
                                                                257/199
(Continued)

FOREIGN PATENT DOCUMENTS

WO    2018160721 A1    9/2018

OTHER PUBLICATIONS

Virot et al. "Integrated Waveguide PIN Photodiodes Exploiting Lateral Si/Ge/Si Heterojunction." Optics Express, vol. 25, No. 16, published on Aug. 7, 2017.
(Continued)

*Primary Examiner* — Shahed Ahmed
(74) *Attorney, Agent, or Firm* — Eschweiler & Potashnik, LLC

(57) ABSTRACT

The present disclosure relates to an integrated chip. The integrated chip includes a substrate having a first semiconductor material. A second semiconductor material is disposed on the first semiconductor material. The second semiconductor material is a group IV semiconductor or a group III-V compound semiconductor. A passivation layer is disposed on the second semiconductor material. The passivation layer includes the first semiconductor material. A first doped region and a second doped region extend through the passivation layer and into the second semiconductor material.

20 Claims, 14 Drawing Sheets

(51) Int. Cl.
*H01L 29/167* (2006.01)
*H01L 29/66* (2006.01)

(58) Field of Classification Search
CPC ......... H01L 31/02162; H01L 31/02327; H01L 31/107; H01L 31/1804; H01L 31/1852; H01L 31/02005; H01L 21/265–266; H01L 21/3215–32155; H01L 21/425–426
See application file for complete search history.

(56) References Cited

U.S. PATENT DOCUMENTS

| | | |
|---|---|---|
| 2015/0333202 A1 | 11/2015 | Ahn et al. |
| 2016/0365426 A1* | 12/2016 | Ching ................ H01L 29/6656 |
| 2017/0040362 A1 | 2/2017 | Na et al. |
| 2020/0350405 A1* | 11/2020 | Tsai ................ H01L 29/66681 |
| 2020/0373416 A1* | 11/2020 | Zhang ............... H01L 29/66795 |

OTHER PUBLICATIONS

Chen et al. "Dark Current Analysis in High-Speed Germanium P-I-N Waveguide Photodetectors." Journal of Applied Physics 119, 213105 (2016), published on Jun. 3, 2016.

* cited by examiner

PASSIVATION LAYER FOR EPITAXIAL SEMICONDUCTOR PROCESS

REFERENCE TO RELATED APPLICATION

This Application claims the benefit of U.S. Provisional Application No. 63/030,980, filed on May 28, 2020, the contents of which are hereby incorporated by reference in their entirety.

BACKGROUND

Integrated chips (ICs) with photonic devices are found in many modern day electronic devices. For example, photonic devices comprising image sensors are used in cameras, video recorders, and other types of photographic systems to capture images. Photonic devices have also found widespread use in other applications such as depth sensors, which are used to determine a distance between a sensor and a target object in a time-of-flight (TOF) system. Depth sensors for TOF systems can be used in smart phones (e.g., for facial recognition), automobiles, drones, robotics, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
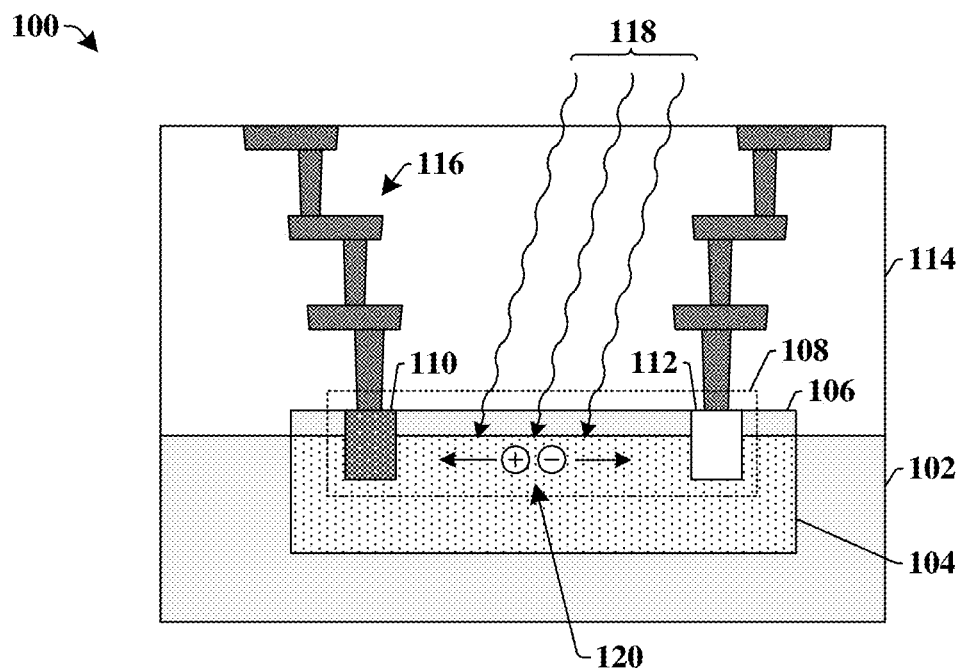
FIG. 1 illustrates a cross-sectional view of some embodiments of an integrated chip comprising a semiconductor device disposed within a semiconductor material that is covered by a passivation layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photonic devices include electronic devices that can generate or detect electromagnetic radiation. For example, some photonic devices (e.g., photodiodes, depth sensors, or the like) are configured to detect electromagnetic radiation by converting photons into electrical current. In such devices, when incident light strikes an atom within a semiconductor body, the atom may release an electron to form an electron-hole pair. The electron and/or the hole are provided to other circuit components to indicate the presence of the incident light.

While silicon is often used in CMOS (complementary metal-oxide-semiconductor) processes, other semiconductor materials may have band-gaps that provide photonic devices with a better performance than silicon. For example, some photonic devices formed in germanium may perform better in NIR (near infrared) applications than photonic devices formed in silicon, since germanium has a high absorption within the NIR spectrum. However, it has been appreciated that leakage currents in germanium based devices is higher than that of silicon based devices due to the smaller band gap of germanium and defects (e.g., interfacial defects) present along an interface between the germanium and an overlying dielectric (e.g., an etch stop layer, an ILD layer, or the like). For example, a leakage current along an upper surface of germanium may be approximately 6 times greater than that of silicon. Furthermore, it has also been appreciated that germanium is more susceptible to dark current than silicon, thereby further aggravating leakage currents.

The present disclosure, in some embodiments, relates to an integrated chip having a second semiconductor material (e.g., germanium, a group IV semiconductor, a group III-V semiconductor, or the like) arranged on a substrate comprising a first semiconductor material (e.g., silicon). A semiconductor device (e.g., a depth sensor, a photodiode, or the like) is arranged within the second semiconductor material, and a passivation layer is disposed over the second semiconductor material. The passivation layer is configured to passivate defects (e.g., interfacial defects) disposed along an upper surface of the second semiconductor material. By passivating defects along the upper surface of the second semiconductor material leakage currents are reduced along the upper surface of the second semiconductor material, thereby improving performance of the semiconductor device.

FIG. 1 illustrates a cross-sectional view of some embodiments of an integrated chip 100 comprising a semiconductor device disposed within a semiconductor material that is covered by a passivation layer.

The integrated chip 100 includes a substrate 102 that comprises or is a first semiconductor material. A second semiconductor material 104 is disposed on the substrate 102. In some embodiments, the second semiconductor material 104 contacts the first semiconductor material of the substrate 102 along one or more surfaces of the substrate 102. For example, in some embodiments, the second semiconductor material 104 may be embedded within the substrate 102, so that the second semiconductor material 104 contacts sidewalls and a horizontally extending surface of the substrate 102 comprising the first semiconductor material. The first semiconductor material of the substrate 102 and the second semiconductor material 104 comprise or are different semiconductor materials. For example, in some embodiments, the first semiconductor material of the substrate 102 may comprise or be silicon and the second semiconductor material 104 may comprise or be a group IV semiconductor material (e.g., germanium), a compound semiconductor material (e.g., a group III-V semiconductor material), or the like.

A semiconductor device 108 is disposed within the second semiconductor material 104. In some embodiments, the semiconductor device 108 may comprise a photodiode (e.g., a PN photodiode, a PIN photodiode, an avalanche photo diode, a single photo avalanche photodiode, or the like), a depth sensor for a time-of-flight (TOF) system, or the like. In some embodiments, the semiconductor device 108 comprises one or more doped regions disposed within the second semiconductor material 104. For example, in some embodiments, the semiconductor device 108 may comprise a first doped region 110 having a first doping type (e.g., n-type) and a second doped region 112 having a second doping type (e.g., p-type) that is different than the first doping type. In some embodiments, the first doped region 110 may be laterally separated from the second doped region 112 by way of the second semiconductor material 104. In some embodiments, the semiconductor device 108 may comprise more than two doped regions.

During operation, incident electromagnetic radiation 118 (e.g., near infrared (NIR) radiation) may strike the second semiconductor material 104 between the first doped region 110 and the second doped region 112. The incident electromagnetic radiation 118 may cause an electron-hole pair 120 to form within the second semiconductor material 104. The second semiconductor material 104 may comprise one or more properties that improve performance of the semiconductor device 108. For example, in some embodiments, the second semiconductor material 104 may comprise a band gap that is smaller than that of silicon (e.g., less than 1.1 eV). In some embodiments, the second semiconductor material 104 may comprise germanium to improve absorption and/or a quantum efficiency of the semiconductor device 108 within an NIR bandwidth (e.g., for electromagnetic radiation having a wavelength of between approximately 800 nm and 2,500 nm).

A passivation layer 106 is disposed over the second semiconductor material 104 and an inter-level dielectric (ILD) structure 114 is disposed over the passivation layer 106. The passivation layer 106 comprises or is a semiconductor material that is different than the second semiconductor material 104. In some embodiments the passivation layer 106 may comprise or be the first semiconductor material. In other embodiments, the passivation layer 106 may comprise or be a semiconductor material that is different than the first semiconductor material and the second semiconductor material 104. A plurality of interconnects 116 are disposed within the ILD structure 114. In various embodiments, the plurality of interconnects 116 may comprise one or more of conductive contacts, interconnect vias, and/or interconnect wires.

Typically, an interface between the second semiconductor material 104 and the ILD structure 114 may comprise defects (e.g., interfacial defects) that can cause leakage currents along an uppermost surface of the second semiconductor material 104. The passivation layer 106 contacts the uppermost surface of the second semiconductor material 104 and passivates defects on the uppermost surface of the second semiconductor material 104 (e.g., to render interfacial defects electrically inoperable). By passivating defects on the uppermost surface of the second semiconductor material 104, leakage currents along the uppermost surface of the second semiconductor material 104 are reduced, thereby improving performance of the semiconductor device 108. Furthermore, it has been appreciated that the passivation layer 106 may also prevent atoms from the second semiconductor material 104 from being re-deposited on other parts of the substrate 102 and/or on other substrates. By preventing atoms from the second semiconductor material 104 from being re-deposited on other parts of the substrate 102 and/or on other substrates, contamination of the substrate 102 and/or the other substrates can be reduced and yield can be improved.

Figure 2:
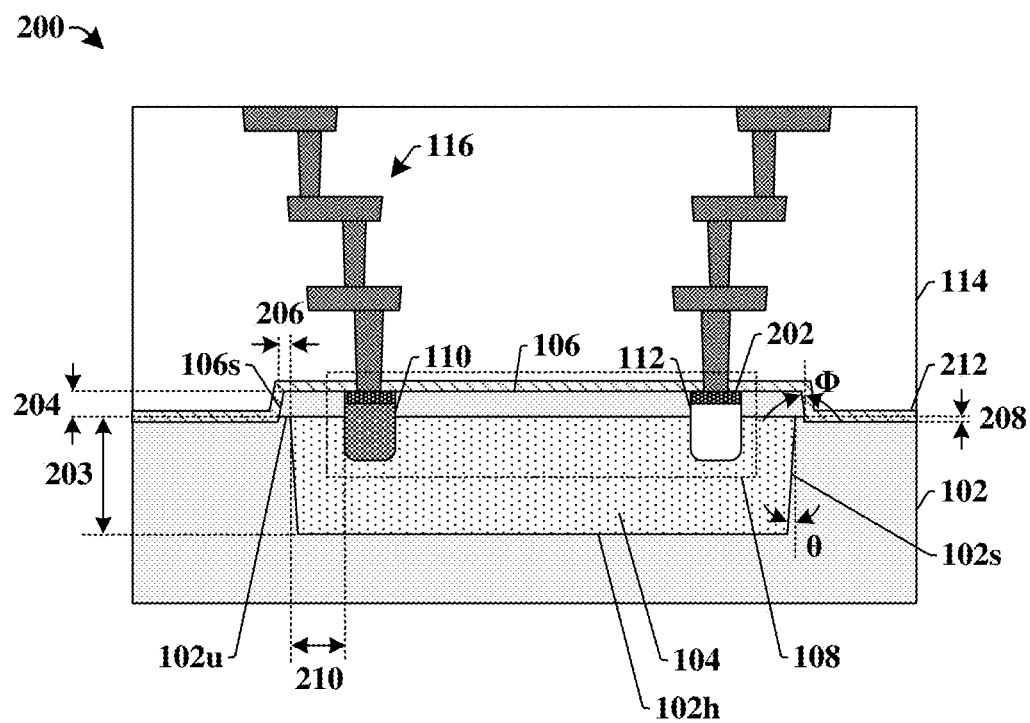
FIG. 2 illustrates a cross-sectional view of some additional embodiments of an integrated chip comprising a semiconductor device disposed within a semiconductor material that is covered by a passivation layer.

FIG. 2 illustrates a cross-sectional view of some additional embodiments of an integrated chip 200 comprising a semiconductor device disposed within a semiconductor material that is covered by a passivation layer.

The integrated chip 200 includes a substrate 102 that comprises or is a first semiconductor material. A second semiconductor material 104 is embedded within the substrate 102, so that the second semiconductor material 104 contacts the first semiconductor material of the substrate 102 along sidewalls 102s and a horizontally extending surface 102h of the substrate 102. In some embodiments, the sidewalls 102s of the substrate 102 may be angled at a first non-zero angle θ with respect to a line that is perpendicular to an upper surface 102u of the substrate 102. In some embodiments, the first non-zero angle θ may be in a range of between approximately 0° and approximately 20°, between approximately 5° and approximately 10°, or other suitable values. In some embodiments, a width of the semiconductor device 108 may increase as a distance over the horizontally extending surface 102h of the substrate 102 increases.

In some embodiments, the first semiconductor material may comprise or be silicon. In some embodiments, the second semiconductor material 104 may comprise or be a group IV semiconductor, such as germanium (Ge), silicon germanium (SiGe), germanium tin (GeSn), silicon carbide (SiC), or the like. In other embodiments, the second semiconductor material 104 may comprise or be a group III-V compound semiconductor, such as gallium arsenide (GaAs), indium phosphide (InP), gallium nitride (GaN), indium gallium arsenide (InGaAs), indium aluminum arsenide (InAlAs), gallium antimonide (GaSb), aluminum antimonide (AlSb), aluminum arsenide (AlAs), aluminum phosphide (AlP), gallium phosphide (GaP), or the like. In various embodiments, the second semiconductor material 104 may have a thickness 203 that is in a range of between approximately 0.5 microns and approximately 0.9 microns, between approximately 0.2 microns and approximately 0.7 microns, or other suitable values.

A passivation layer 106 is disposed over the second semiconductor material 104. In some embodiments, sidewalls 106s of the passivation layer 106 may be directly over the substrate 102 and/or the second semiconductor material 104. In some embodiments, the sidewalls 106s may be angled at a second non-zero angle Φ with respect to the line that is perpendicular to the upper surface of the substrate 102. In some embodiments, the second non-zero angle Φ may be in a range of between approximately 0° and approximately 20°, between approximately 5° and approximately 10°, or other suitable values. In some embodiments, a width of the passivation layer 106 may decrease as a distance over the second semiconductor material 104 increases.

In some embodiments, the passivation layer 106 may comprise the first semiconductor material. For example, in various embodiments, the passivation layer 106 may comprise or be silicon, polysilicon, amorphous silicon, single crystal silicon, or the like. In various embodiments, the passivation layer 106 may have a thickness 204 that is in a range of between approximately 1 Angstrom (Å) and approximately 10,000 Å. In some additional embodiments, the passivation layer 106 may be formed to a thickness 204 of approximately 500 Å, approximately 1,000 Å, approximately 1,500 Å, approximately 2,000 Å, approximately 3,000 Å, approximately 4,000 Å, approximately 5,000 Å, approximately 6,000 Å, approximately 7,000 Å, approximately 8,000 Å, approximately 9,000 Å, approximately 10,000 Å, or the like. In some embodiments, the second semiconductor material 104 continuously extends between a bottommost surface that contacts the first semiconductor material of the substrate 102 and a topmost surface contacting the passivation layer 106.

In some embodiments, a maximum width of the passivation layer 106 may be substantially equal to a maximum width of the second semiconductor material 104. In other embodiments, the passivation layer 106 may have a maximum width that is different than a maximum width of the second semiconductor material 104. For example, in some embodiments a maximum width of the passivation layer 106 may be greater than a maximum width of the second semiconductor material 104. In some such embodiments, the substrate 102 may have a first upper surface directly below the passivation layer 106 and a recessed upper surface that is a non-zero distance 208 below the first upper surface and that is laterally outside of the passivation layer 106. In some alternative embodiments (not shown), a width of the passivation layer 106 may be less than a width of the second semiconductor material 104. In some embodiments, the passivation layer 106 laterally extends a non-zero distance 206 past one or more outermost sidewalls of the second semiconductor material 104. In some embodiments (not shown), the second semiconductor material 104 laterally extends a non-zero distance past one or more outermost sidewalls of the passivation layer 106.

A first doped region 110 and a second doped region 112 are arranged within the passivation layer 106 and the second semiconductor material 104. In some embodiments, the second semiconductor material laterally extends a distance 210 past the first doped region 110 and/or the second doped region 112. In some embodiments, the first doped region 110 is not separated from the second doped region 112 by way of a gate structure. In some embodiments, the first doped region 110 and the second doped region 112 are separated from a bottom of the second semiconductor material 104 by one or more non-zero distances. A silicide 202 is disposed along tops of the first doped region 110 and the second doped region 112. In some embodiments, the silicide 202 has a lower surface that is above a bottom surface of the passivation layer 106. In some embodiments, the silicide 202 may comprise silicon and a metal (e.g., tin, nickel, or the like).

An inter-level dielectric (ILD) structure 114 is disposed on the substrate 102 and the passivation layer 106. The ILD structure 114 surrounds a plurality of interconnects 116. The plurality of interconnects 116 are electrically coupled to the first doped region 110 and the second doped region 112. If the passivation layer 106 is too thin (e.g., less than approximately 10 microns, less than approximately 1 micron, or the like), the silicide 202 cannot be formed onto the passivation layer 106, thereby increasing a resistance between the first doped region 110 and/or the second doped region 112 and an overlying interconnect.

In some embodiments, the ILD structure 114 may extend along the sidewalls 106s of the passivation layer 106. In some embodiments, the ILD structure 114 may comprise a plurality of stacked ILD layers. In some embodiments, the plurality of stacked ILD layers may comprise one or more of silicon dioxide, carbon doped silicon dioxide, silicon oxynitride, borosilicate glass (BSG), phosphorus silicate glass (PSG), borophosphosilicate (BPSG), fluorosilicate glass (FSG), undoped silicate glass (USG), a porous dielectric material, or the like. In some embodiments, a contact etch stop layer (CESL) 212 may laterally and vertically separate the ILD structure 114 from the passivation layer 106 and the substrate 102. In some embodiments, the CESL 212 may laterally extend past opposing sides of the passivation layer 106.

Figure 3A:
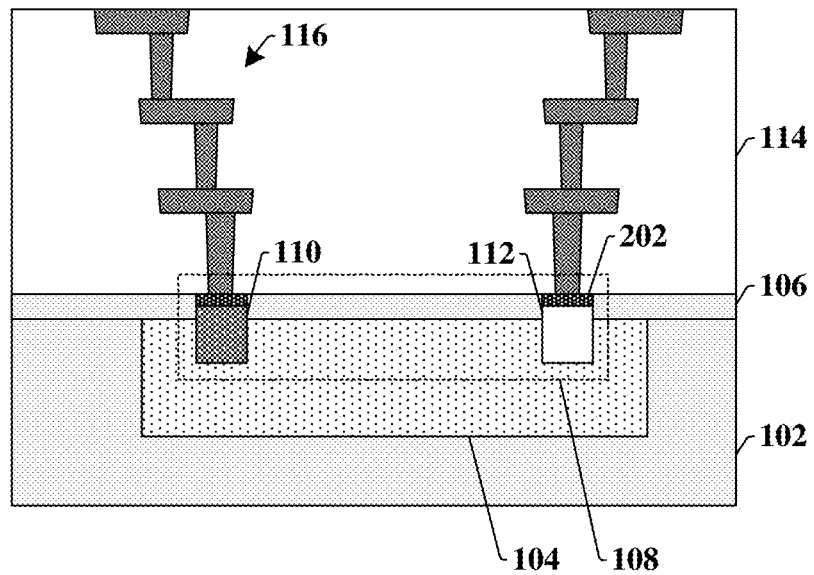
FIGS. 3A-3C illustrate cross-sectional views of some alternative embodiments of an integrated chip comprising a semiconductor device disposed within a semiconductor material that is covered by a passivation layer.

FIG. 3A illustrates a cross-sectional view of some alternative embodiments of an integrated chip 300 comprising a semiconductor device disposed within a semiconductor material that is covered by a passivation layer.

The integrated chip 300 includes a substrate 102 that comprises or is a first semiconductor material. A second semiconductor material 104 is embedded within the substrate 102, so that the second semiconductor material 104 contacts sidewalls and a horizontally extending surface of the first semiconductor material of the substrate 102.

A passivation layer 106 is arranged on upper surfaces of the substrate 102 and the second semiconductor material 104. An ILD structure 114 is disposed on the passivation layer 106. The passivation layer 106 vertically separates the upper surfaces of the second semiconductor material 104 and the substrate 102 from a lower surface of the ILD structure 114. In some embodiments (not shown), a contact etch stop layer may be arranged between the passivation layer 106 and the ILD structure 114.

In some embodiments, the passivation layer 106 completely covers upper surfaces of both the substrate 102 and the second semiconductor material 104. In some embodiments, the passivation layer 106 vertically contacts upper surfaces of both the substrate 102 and the second semiconductor material 104. By having the passivation layer 106 cover upper surfaces of both the substrate 102 and the second semiconductor material 104, a fabrication process used to form the integrated chip 300 can be simplified by eliminating patterning processes used to pattern the passivation layer 106.

Figure 3B:
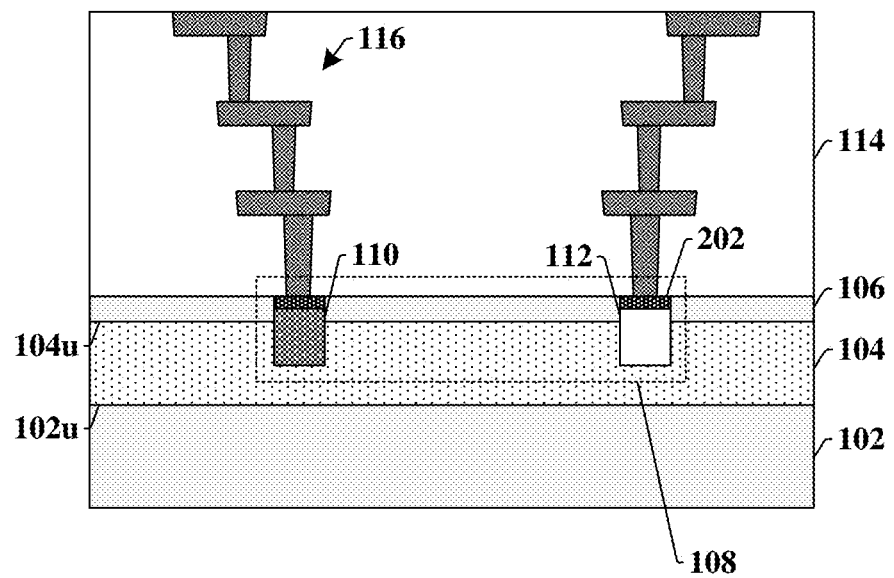

FIG. 3B illustrates a cross-sectional view of some alternative embodiments of an integrated chip 302 comprising a semiconductor device disposed within a semiconductor material that is covered by a passivation layer.

The integrated chip 302 includes a substrate 102 that comprises or is a first semiconductor material. A second semiconductor material 104 is disposed on the substrate 102. A bottom surface of the second semiconductor material 104 contacts an upper surface 102u of the first semiconductor material of the substrate 102 along a horizontally extending interface. A passivation layer 106 is arranged on an upper surface 104u of the second semiconductor material 104. In some embodiments, the second semiconductor material 104 continuously extends from a lower surface contacting the substrate 102 to the upper surface 104u, which contacts the passivation layer 106.

An ILD structure 114 is disposed on the passivation layer 106. The passivation layer 106 separates the second semiconductor material 104 from the ILD structure 114. In some embodiments (not shown), a contact etch stop layer may be arranged vertically between the passivation layer 106 and the ILD structure 114. By having the second semiconductor material 104 cover the upper surface 102u of the substrate 102 and by having the passivation layer 106 cover the upper surface 104u of the second semiconductor material 104, a fabrication process used to form the integrated chip can be simplified by eliminating patterning processes and planarization processes.

Figure 3C:
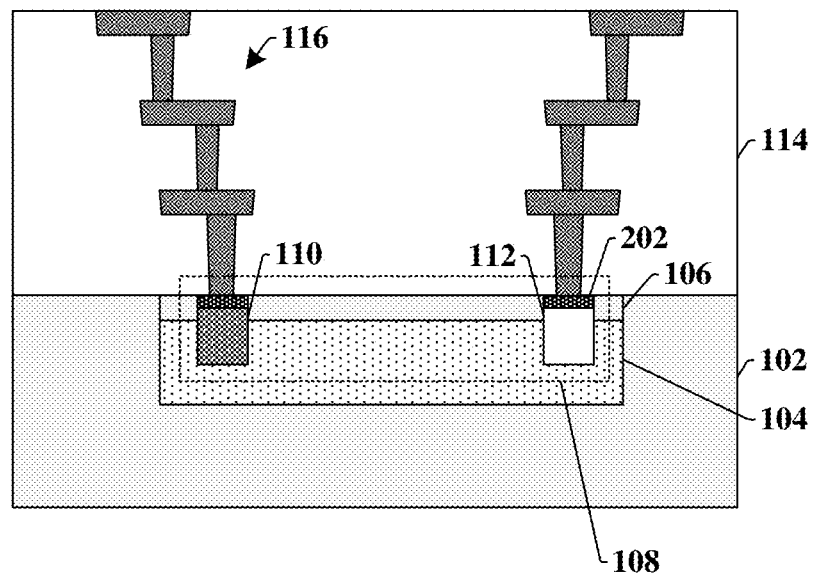

FIG. 3C illustrates a cross-sectional view of some alternative embodiments of an integrated chip 304 comprising a semiconductor device disposed within a semiconductor material that is covered by a passivation layer.

The integrated chip 304 includes a substrate 102 that comprises or is a first semiconductor material. A second semiconductor material 104 is disposed on the substrate 102. The second semiconductor material 104 contacts sidewalls and a horizontally extending surface of the first semiconductor material of the substrate 102. A passivation layer 106 is arranged on an upper surface of the second semiconductor material 104. In some embodiments, the passivation layer 106 is also arranged along sidewalls of the substrate 102. In some embodiments, the passivation layer 106 and the substrate 102 have upper surfaces that are substantially co-planar (e.g., co-planar within a tolerance of a chemical mechanical planarization process).

Figure 4:
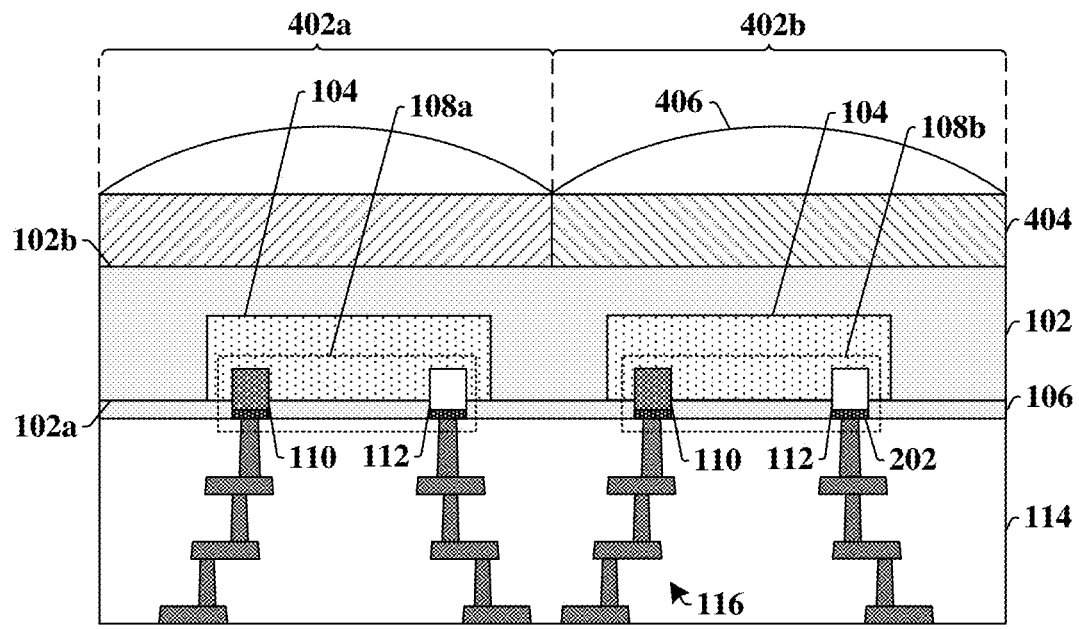
FIG. 4 illustrates a cross-sectional view of some embodiments of an integrated chip comprising a photonic device disposed within a semiconductor material that is covered by a passivation layer.

FIG. 4 illustrates a cross-sectional view of some embodiments of an image sensing integrated chip 400 comprising a photonic device disposed within a semiconductor material that is covered by a passivation layer.

The image sensing integrated chip 400 comprises a plurality of pixel regions 402a-402b disposed within a substrate 102 that comprises or is a first semiconductor material. The plurality of pixel regions 402a-402b respectively comprise a second semiconductor material 104 embedded within the substrate 102. A first doped region 110 and a second doped region 112 are disposed within the second semiconductor material 104 within respective ones of the plurality of pixel regions 402a-402b. The first doped region 110 and the second doped region 112 define a plurality of semiconductor devices 108a-108b. In some embodiments, the plurality of semiconductor devices 108a-108b are configured to detect incident radiation.

A passivation layer 106 is disposed along a first side 102a of the substrate 102. In some embodiments, the passivation layer 106 continuously extends past two or more of the plurality of pixel regions 402a-402b. In other embodiments (not shown), the passivation layer 106 within each of the plurality of pixel regions 402a-402b is separated from a passivation layer within an adjacent pixel region, so that the passivation layer 106 does not continuously extend past two or more of the plurality of pixel regions 402a-402b. An ILD structure 114 is arranged on the passivation layer 106. The ILD structure 114 surrounds a plurality of interconnects 116.

In some embodiments, a plurality of color filters 404 are arranged along a second side 102b of the substrate 102. The plurality of color filters 404 are configured to transmit specific wavelengths of incident radiation. For example, a first color filter of the plurality of color filters 404 may be configured to transmit radiation having wavelengths within a first range (e.g., corresponding to green light), while reflecting radiation having wavelengths within a second range (e.g., corresponding to red light) different than the first range, etc. A plurality of micro-lenses 406 are disposed on the plurality of color filters 404. The plurality of micro-lenses 406 are configured to focus radiation towards the plurality of pixel regions 402a-402b.

Figure 5:
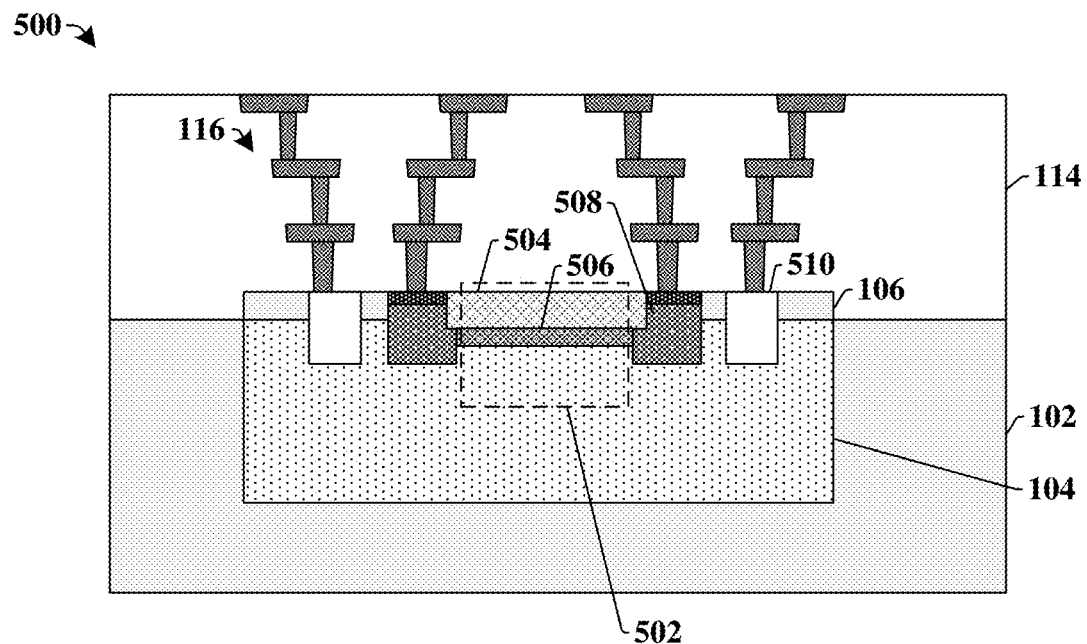
FIG. 5 illustrates a cross-sectional view of some alternative embodiments of an integrated chip comprising a photonic device disposed within a semiconductor material that is covered by a passivation layer.

FIG. 5 illustrates a cross-sectional view of some alternative embodiments of an integrated chip 500 comprising a photonic device disposed within a semiconductor material that is covered by a passivation layer.

The integrated chip 500 comprises a second semiconductor material 104 embedded within a substrate 102 that comprises or is a first semiconductor material. An active region 502 is arranged between a guard ring comprising one or more first doped regions 508. In some embodiments, the active region 502 comprises a shallow doped region 504 arranged within the second semiconductor material 104. In some embodiments, the active region 502 may further comprise a lower doped region 506 disposed within the second semiconductor material 104 below the shallow doped region 504. The guard ring laterally separates the active region 502 from a sinker comprising one or more second doped regions 510. In some embodiments, the doping type of the shallow doped region 504 and the lower doped region 506 may be different, while the doping type of the shallow doped region 504 may be the same as the one or more first doped regions 508 and different than the one or more second doped regions 510. For example, in some embodiments, the shallow doped region 504 and the one or more first doped regions 508 may have a first doping type (e.g., a p-type doping), while the lower doped region 506 and the one or more second doped regions 510 may have a second doping type (e.g., an n-type doping).

A passivation layer 106 is arranged over the second semiconductor material 104. The one or more first doped regions 508 and the one or more second doped regions 510 vertically extend through the passivation layer 106 and into the second semiconductor material 104. An ILD structure 114 is disposed over the passivation layer 106. The ILD structure 114 surrounds a plurality of interconnects 116 that are coupled to the shallow doped region 504 and the one or more second doped regions 510. During operation, bias voltages can be applied to the shallow doped region 504 and the one or more second doped regions 510 by way of the plurality of interconnects 116. In some embodiments, the bias voltages may exceed a breakdown voltage of the device.

Figure 6A:
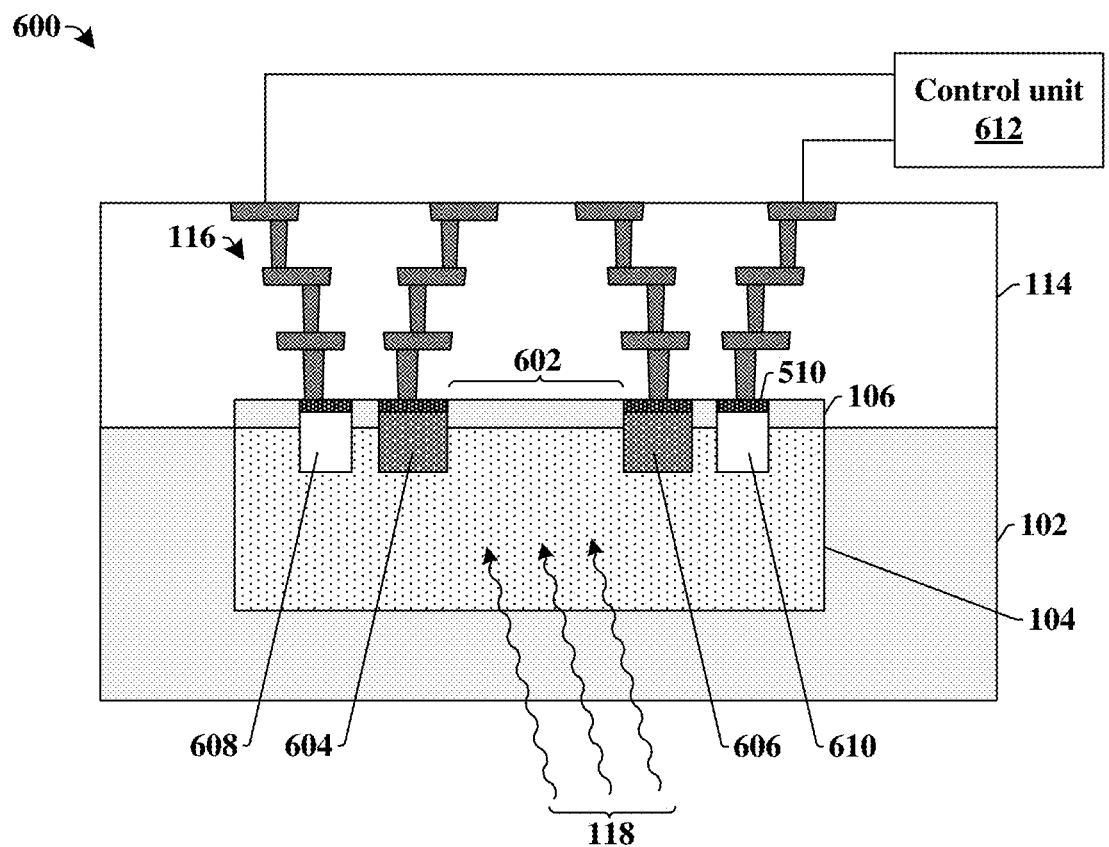
FIG. 6A illustrates a cross-sectional view of some embodiments of an integrated chip comprising a depth sensor disposed within a semiconductor material that is covered by a passivation layer.

FIG. 6A illustrates a block diagram of some embodiments of an integrated chip 600 comprising a depth sensor for a time-of-flight (TOF) system.

The integrated chip 600 comprises a second semiconductor material 104 embedded within a substrate 102 that comprises or is a first semiconductor material. A first doped region 604 and a second doped region 606 are arranged within the second semiconductor material 104 around a central region 602. A third doped region 608 and a fourth doped region 610 are also arranged within the second semiconductor material 104 and laterally surround the first doped region 604 and the second doped region 606. The first doped region 604 and the second doped region 606 comprise a first doping type (e.g., p-type doping), while the third doped region 608 and the fourth doped region 610 comprise a second doping type (e.g., n-type doping) that is different than the first doping type.

A passivation layer 106 is arranged over the second semiconductor material 104. The first doped region 604, the second doped region 606, the third doped region 608, and the fourth doped region 610 vertically extend through the passivation layer 106 and into the second semiconductor material 104. An ILD structure 114 is disposed over the passivation layer 106. The ILD structure 114 surrounds a plurality of interconnects 116. In some embodiments, the plurality of interconnects 116 are electrically coupled to the first doped region 604, the second doped region 606, the third doped region 608, and the fourth doped region 610. In some alternative embodiments (not shown), rather than being electrically couple to the first doped region 604 and the second doped region 606, the plurality of interconnects 116 may be electrically coupled to gate structures disposed on the first doped region 604 and the second doped region 606.

During operation, incident electromagnetic radiation 118 that strikes the second semiconductor material 104 causes charge carriers to form within the central region 602. A control unit 612 is configured to selectively apply bias voltages to the third doped region 608 and/or the fourth doped region 610. In some embodiments, the control unit 612 may alternating apply bias voltages to the third doped region 608 and/or the fourth doped region 610. When a bias voltage is applied to the third doped region 608, an electric field generated by charges within the third doped region 608 may cause charge carriers to move from the central region 602 to the first doped region 604. When a bias voltage is applied to the fourth doped region 610, an electric field generated by charges within the fourth doped region 610 may cause charge carriers to move from the central region 602 to the fourth doped region 610.

Figure 6B:
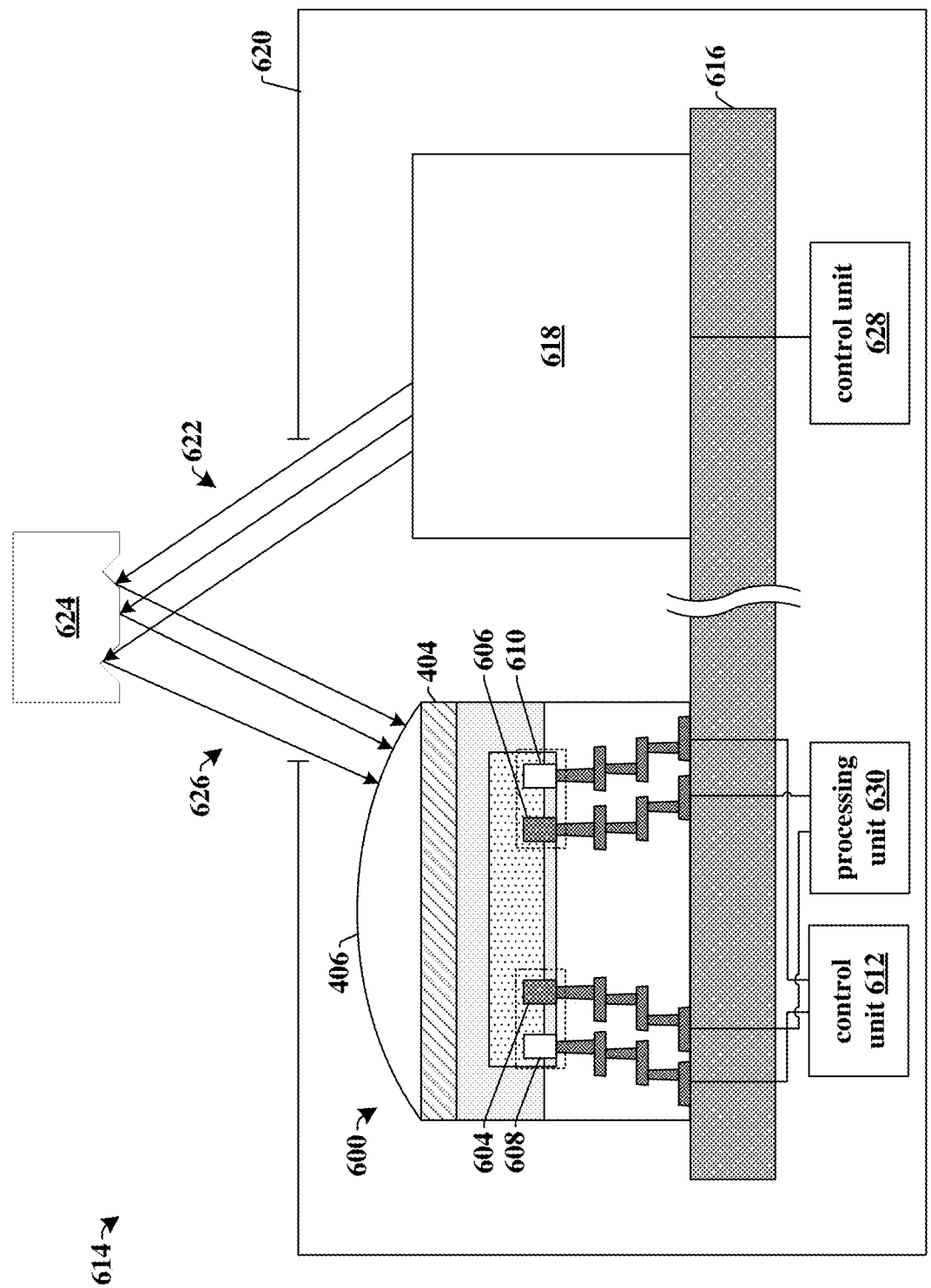
FIG. 6B illustrates a block diagram of some embodiments of a time-of-flight (TOF) system comprising a disclosed depth sensor.

FIG. 6B illustrates a block diagram of some embodiments of time-of-flight (TOF) system 614 comprising a disclosed depth sensor.

The TOF system 614 comprises an integrated chip 600 disposed on a package substrate 616. The integrated chip 600 comprises a depth sensor (e.g., as described above in FIG. 6A). In some embodiments, the package substrate 616 may comprise a printed circuit board, an interposer substrate, or the like. An illumination integrated chip 618 is also disposed on the package substrate 616. In some embodiments, the illumination integrated chip 618 may comprise a light emitting diode, a VCSEL (vertical cavity surface emitting laser), or the like. In some embodiments, a package 620 surrounds the integrated chip 600 and the illumination integrated chip 618.

In some embodiments, during operation, the illumination integrated chip 618 is configured to generate illuminating electromagnetic radiation 622 (e.g., NIR radiation). In some such embodiments, a second control unit 628 is configured to operate the illumination integrated chip 618 for short periods of time (e.g., less than or equal to approximately 50 ns) to generate pulses of the illuminating electromagnetic radiation 622. The pulses of the illuminating electromagnetic radiation 622 may bounce off of a target object 624 and reflect back towards the integrated chip 600 as reflected electromagnetic radiation 626. The integrated chip 600 is configured to detect the reflected electromagnetic radiation 626. A control unit 612 is configured to synchronize bias voltages applied to the third doped region 608 and/or the fourth doped region 610 with the length of the pulses of the illuminating electromagnetic radiation 622 generated by the illumination integrated chip 618, so that a first part of charge carriers generated by a pulse of illuminating electromagnetic radiation 622 are sent to the first doped region 604 and a second part of the charge carriers generated by the pulse are sent to the second doped region 606.

Over time, a first charge $Q_1$ will build up on the third doped region 608 and a fourth charge $Q_2$ will build up on the fourth doped region 610. The first charge $Q_1$ will be different than the second charge $Q_2$ due to a delay of the illuminating electromagnetic radiation 622 that depends on a distance to the target object 624. A processing unit 630 is configured to receive electric signals representing the first charge $Q_1$ and the second charge $Q_2$ and to determine a distance to the target object 624 from a ratio of the first charge $Q_1$ and the second charge $Q_2$ (e.g., $d=\frac{1}{2}c\Delta t\ (Q_2/(Q_1+Q_e))$, where d is a distance to the target object 624, c is the speed of light, and $\Delta t$ is a length of the pulse of illuminating electromagnetic radiation 622). In some embodiments, a distance to the target object 624 can be calculated for each pixel within the integrated chip 600 and can be used to form a three-dimensional image of the target object 624.

In some embodiments, the control unit 612, the second control unit 628, and/or the processing unit 630 may be formed within one or more integrated chip die that are disposed within the package 620. In some embodiments, the control unit 612, the second control unit 628, and/or the processing unit 630 may be part of a 2.5DIC or a 3DIC system.

FIGS. 7-13 illustrate cross-sectional views 700-1300 of some embodiments of an integrated chip comprising a semiconductor device disposed within a semiconductor material that is covered by a passivation layer. Although FIGS. 7-13 are described in relation to a method, it will be appreciated that the structures disclosed in FIGS. 7-13 are not limited to such a method, but instead may stand alone as structures independent of the method.

Figure 7:
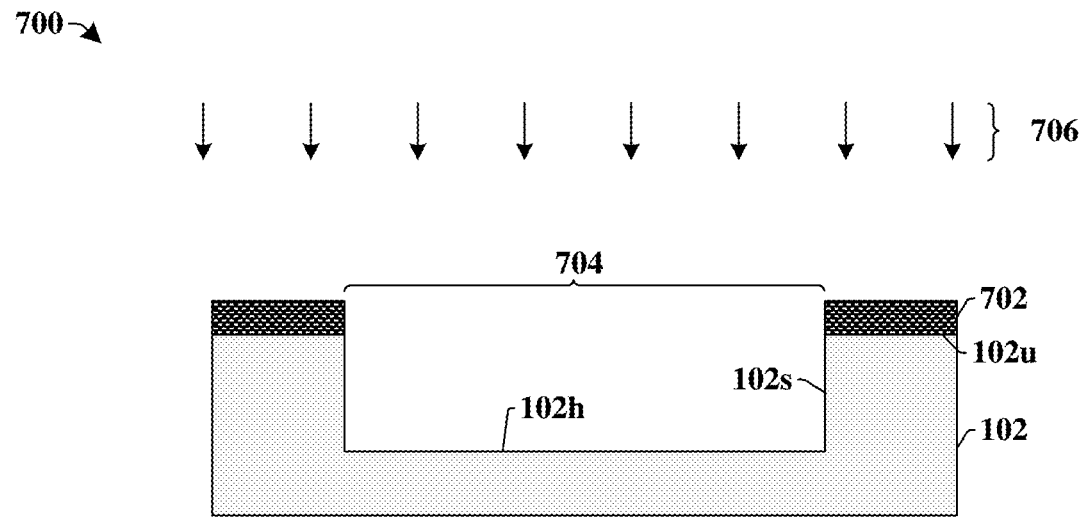
FIGS. 7-13 illustrate cross-sectional views of some embodiments of a method of forming an integrated chip comprising a semiconductor device disposed within a semiconductor material that is covered by a passivation layer.

As shown in cross-sectional view 700 of FIG. 7, a first masking layer 702 is formed over a substrate 102. The first masking layer 702 comprises sidewalls defining an opening that exposes an upper surface 102u of the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 may comprise or be a first semiconductor material. In some embodiments, the first semiconductor material may comprise or be silicon. In other embodiments, the first semiconductor material may comprise or be a germanium, gallium, or the like. In some embodiments, the first masking layer 702 may comprise a photosensitive material (e.g., a photoresist). In such embodiments, the first masking layer 702 may be formed onto the substrate 102 by a spin coating process. The first masking layer is subsequently exposed to electromagnetic radiation (e.g., ultraviolet light) followed by a development process. In other embodiments, the first masking layer 702 may comprise a hard mask layer comprising a carbide (e.g., silicon carbide, silicon oxycarbide, or the like), a nitride (e.g., silicon nitride, silicon oxynitride, titanium nitride, or the like), an oxide (e.g., silicon oxide, titanium oxide, or the like), or the like.

The substrate 102 is selectively patterned according to the first masking layer 702 to form a recess 704 extending into the substrate 102. The recess 704 is defined by sidewalls 102s and a horizontally extending surface 102h of the substrate 102. In some embodiments, the sidewalls 102s and the horizontally extending surface 102h may be the first semiconductor material (e.g., silicon). In some embodiments, the substrate 102 may be selectively patterned by exposing the substrate 102 to a first etchant 706 in areas exposed by the first masking layer 702. In some embodiments, the first etchant 706 may comprise a dry etchant (e.g., having a fluorine chemistry, a chlorine chemistry, or the like). In other embodiments, the first etchant 706 may comprise a wet etchant (e.g., comprising hydrofluoric acid, potassium hydroxide, or the like).

Figure 8:
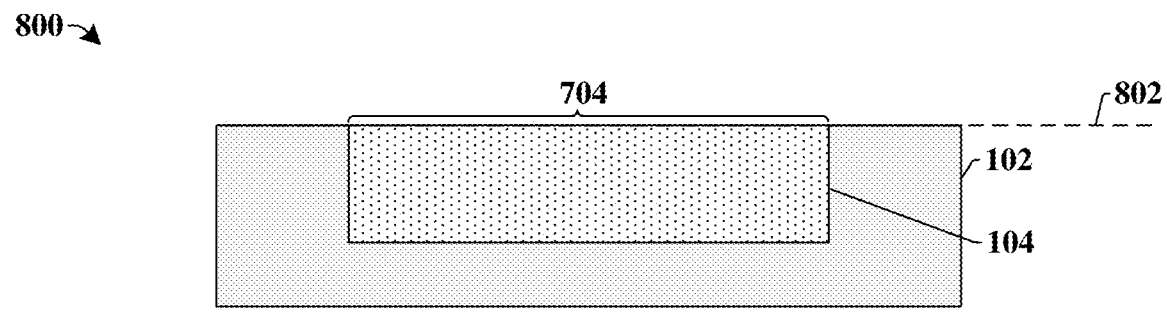

As shown in cross-sectional view 800 of FIG. 8, a second semiconductor material 104 is formed within the recess 704 in the substrate 102. The second semiconductor material 104 is different than the first semiconductor material of the substrate 102. In some embodiments, the second semiconductor material 104 may comprise or be a group IV semiconductor, a compound semiconductor (e.g., a group III-V compound semiconductor), or the like. For example, in some embodiments the second semiconductor material 104 may comprise or be Ge, SiGe, GeSn, SiC, or the like. In other embodiments, the second semiconductor material 104 may comprise or be GaAs, InP, GaN, InGaAs, InAlAs, GaSb, AlSb, AlAs, AlP, GaP, or the like.

In some embodiments, the second semiconductor material 104 may be formed by way of an epitaxial growth process. For example, in various embodiments, the second semiconductor material 104 may be formed by a chemical vapor deposition (CVD) process, a plasma enhanced CVD (PECVD) process, an atomic layer deposition (ALD) process, a physical vapor deposition (PVD) process, a molecular beam epitaxy (MBE) process, or the like. In some embodiments, the second semiconductor material 104 may be formed within the recess 704 and above the upper surface 102u of the substrate 102. In some such embodiments, a planarization process (e.g., a CMP process) is performed on the second semiconductor material 104. The planarization process is performed along line 802 to remove a part of the second semiconductor material 104 over the substrate 102. In some embodiments, the planarization process causes an upper surface of the second semiconductor material 104 to be substantially co-planar with an upper surface 102u of the substrate 102. In some embodiments, the planarization process may comprise a chemical mechanical polishing (CMP) process.

Figure 9A:
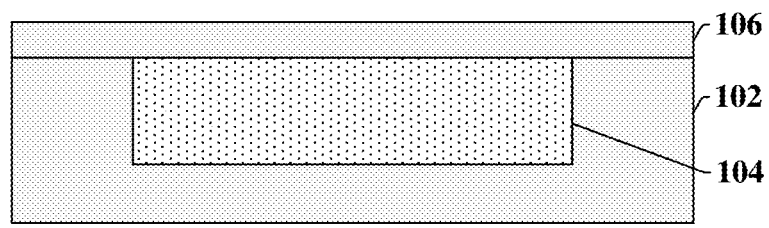

As shown in cross-sectional view 900 of FIG. 9A, a passivation layer 106 is formed onto the substrate 102 and the second semiconductor material 104. The passivation layer 106 continuously extends from directly over the second semiconductor material 104 to past opposing sidewalls of the second semiconductor material 104. The passivation layer comprises or is a semiconductor material. In some embodiments, the passivation layer 106 may comprise or be the first semiconductor material. In various embodiments, the passivation layer 106 may comprise or be silicon, polysilicon, amorphous silicon, single crystal silicon, or the like.

In various embodiments, the passivation layer 106 may be formed by epitaxial growth technique. For example, the passivation layer 106 may be formed by way of low-pressure chemical vapor deposition (LPCVD), selective LPCVD, epitaxial furnace growth, or the like. In various embodiments, the passivation layer 106 may be formed to a thickness in a range of between approximately 1 Angstrom (Å) and approximately 10,000 Å. In some additional embodiments, the passivation layer 106 may be formed to a thickness in a range of between approximately 100 Å and approximately 9,000 Å, approximately 3,000 Å and approximately 7,000 Å, or the like.

Figure 9B:
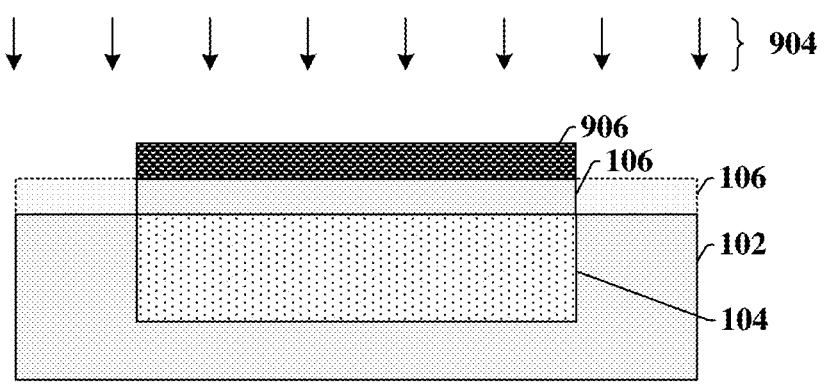

As shown in cross-sectional view 902 of FIG. 9B, the passivation layer 106 may be selectively patterned in some embodiments. Selectively patterning the passivation layer 106 causes the passivation layer 106 to have sidewalls that are over the substrate 102 and/or the second semiconductor material 104. In some embodiments, the sidewalls of the passivation layer 106 are substantially aligned with sidewalls of the second semiconductor material 104. In other embodiments, the passivation layer 106 may have a greater width or a smaller width than the second semiconductor material 104. In some embodiments, the passivation layer 106 may be selectively patterned by exposing the substrate 102 to a second etchant 904 in areas exposed by a second masking layer 906. In various embodiments, the passivation layer 106 may be selectively patterned using a dry etching process (e.g., comprising a chlorine or fluorine etching chemistry) or a wet etching process (e.g., comprising hydrofluoric acid, potassium hydroxide, or the like).

Figure 10:
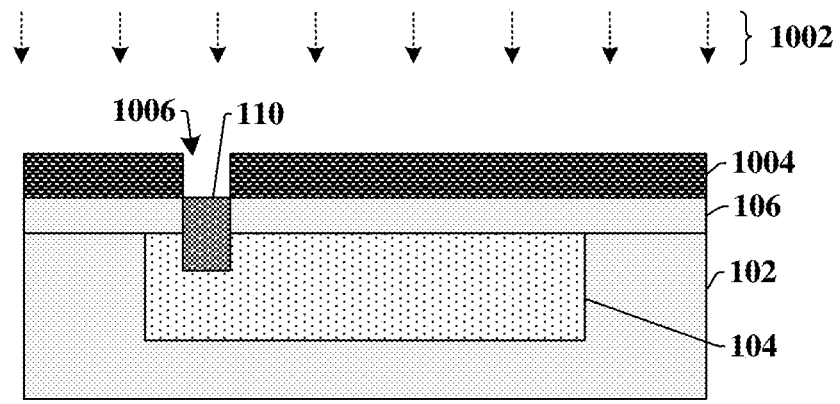

As shown in cross-sectional view 1000 of FIG. 10, a first implantation process is performed to form a first doped region 110 within both the passivation layer 106 and the second semiconductor material 104. In some embodiments, the first implantation process forms the first doped region 110 to have a first doping type (e.g., n-type). In some embodiments, the first implantation process may be performed by implanting one or more first dopant species 1002 according to a third masking layer 1004 having a first opening 1006 over the second semiconductor material 104. In some embodiments, the one or more first dopant species 1002 may comprise one or more of boron, gallium, indium, or the like. In some embodiments, the third masking layer 1004 may comprise a photosensitive material (e.g., a photoresist).

Figure 11:
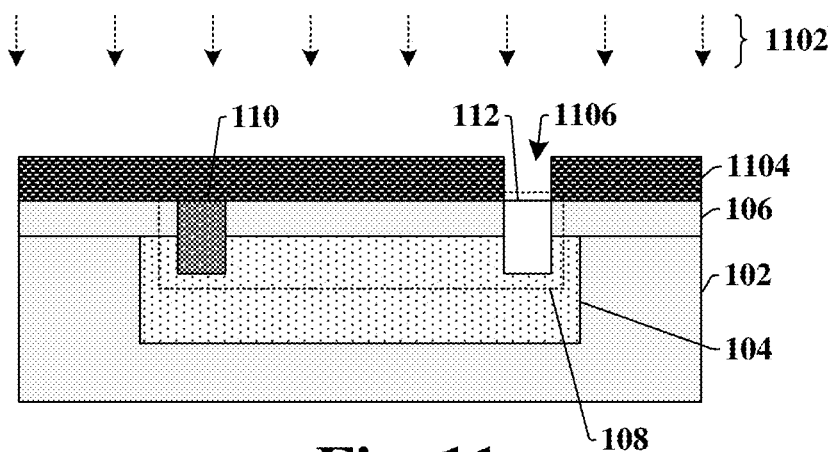

As shown in cross-sectional view 1100 of FIG. 11, a second implantation process is performed to form a second doped region 112 within both the passivation layer 106 and the second semiconductor material 104. In some embodiments, the second doped region 112 is laterally separated from the first doped region 110 by a non-zero distance extending through the second semiconductor material 104. In some embodiments the second implantation process forms the second doped region 112 to have a second doping type (e.g., p-type). In some embodiments, the second implantation process may be performed by implanting one or more second dopant species 1102 according to a fourth masking layer 1104 having a second opening 1106 over the second semiconductor material 104. In some embodiments, the one or more second dopant species 1102 may comprise one or more of phosphorus, arsenic, or the like. In some embodiments, the fourth masking layer 1104 may comprise a photosensitive material (e.g., a photoresist).

Figure 12:
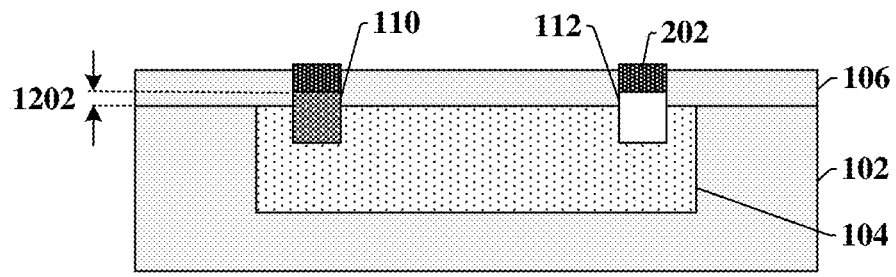

As shown in cross-sectional view 1200 of FIG. 12, a salicide process is performed to form a silicide 202 along tops of the first doped region 110 and the second doped region 112. In some embodiments, the silicide 202 has a bottom surface that is a distance 1202 over a bottom surface of the passivation layer 106. In some embodiments, the salicide process may be performed by depositing a metal layer (e.g., a nickel layer) and then performing a thermal annealing process (e.g., a rapid thermal anneal) to form the silicide 202.

Figure 13:
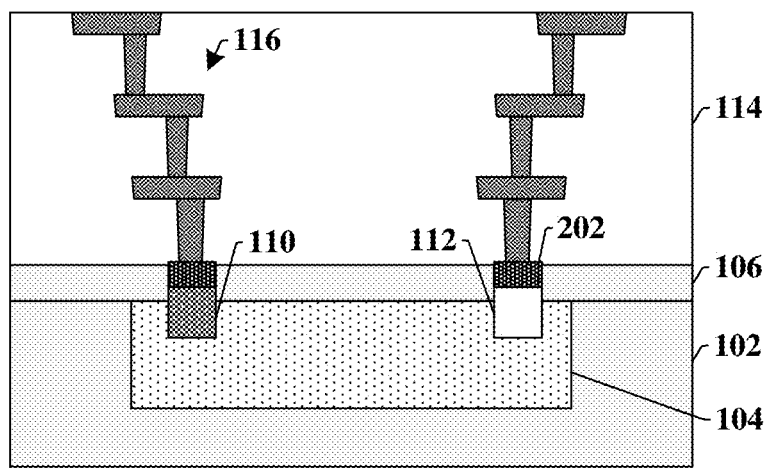

As shown in cross-sectional view 1300 of FIG. 13, one or more interconnects 116 may be formed within an inter-level dielectric (ILD) structure 114 formed over the substrate 102. In some embodiments, the ILD structure 114 may comprise a plurality of stacked ILD layers. In some embodiments, the one or more interconnects 116 may comprise one or more of a conductive contact, an interconnect wire, and/or an interconnect via. In some embodiments, the one or one or more interconnects 116 may be formed by forming an ILD layer over the substrate 102, selectively etching the ILD layer to define a via hole and/or a trench within the ILD layer, forming a conductive material (e.g., copper, aluminum, etc.) within the via hole and/or the trench, and performing a planarization process (e.g., a chemical mechanical planarization process) to remove excess of the conductive material from over the ILD layer.

Figure 14:
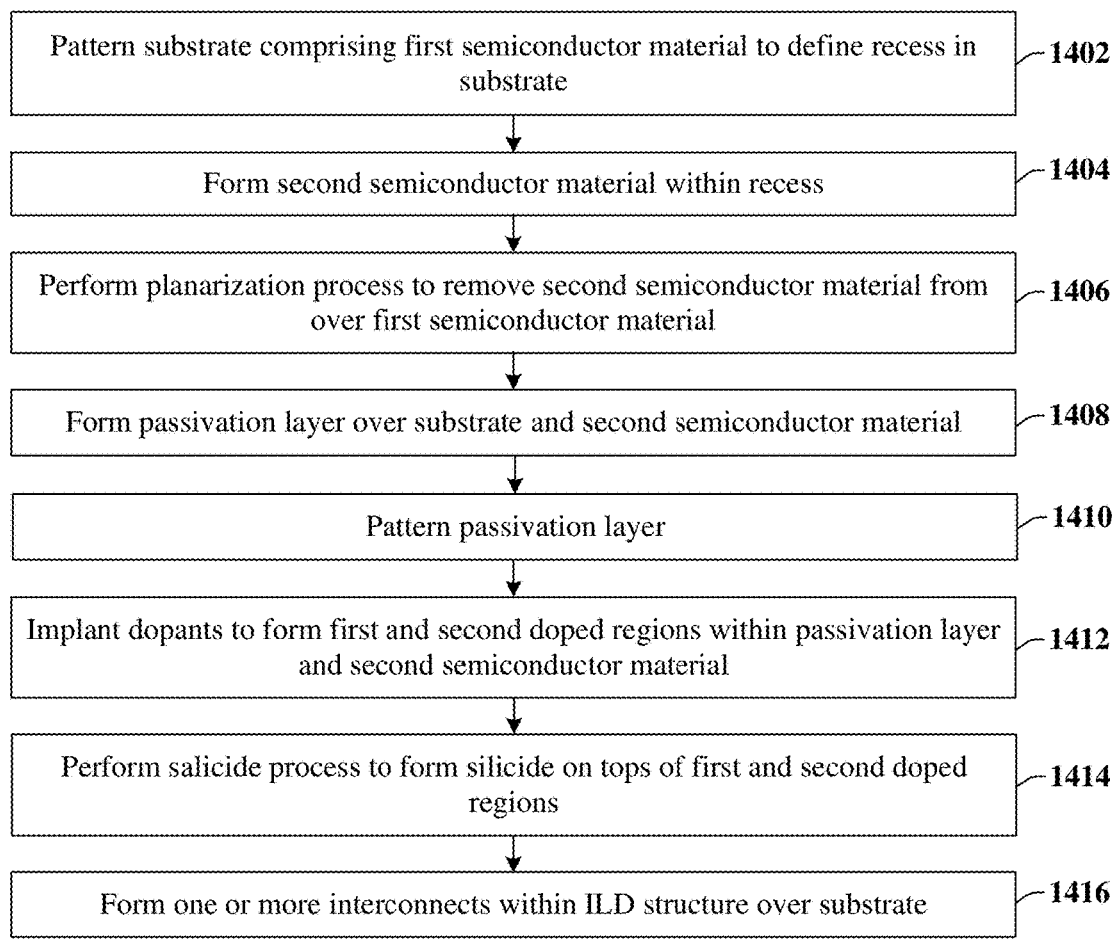
FIG. 14 illustrates a flow diagram of some embodiments of a method of forming an integrated chip comprising a semiconductor device disposed within a semiconductor material that is covered by a passivation layer.

FIG. 14 illustrates a flow diagram of some embodiments of a method 1400 of forming an integrated chip comprising a semiconductor device disposed within a semiconductor material that is covered by a passivation layer.

While the disclosed methods (e.g., 1400 and 2100) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1402, a substrate comprising a first semiconductor material is patterned to define a recess within the substrate. FIG. 7 illustrates a cross-sectional view 700 of some embodiments corresponding to act 1402.

At act 1404, a second semiconductor material is formed within the recess. FIG. 8 illustrates a cross-sectional view 800 of some embodiments corresponding to act 1404.

At act 1406, a planarization process is performed to remove the second semiconductor material from over the first semiconductor material. FIG. 8 illustrates a cross-sectional view 800 of some embodiments corresponding to act 1406.

At act 1408, a passivation layer is formed over the substrate and the second semiconductor material. In some embodiments, the passivation layer comprises the first semiconductor material. FIG. 9A illustrates a cross-sectional view 900 of some embodiments corresponding to act 1408.

At act 1410, the passivation layer is patterned, in some embodiments. FIG. 9B illustrates a cross-sectional view 902 of some embodiments corresponding to act 1410.

At act 1412, dopants are implanted to form first and second doped regions within the passivation layer and the second semiconductor material. In some embodiments, the first and second doped regions have different doping types. FIGS. 10-11 illustrate cross-sectional views 1100 of some embodiments corresponding to act 1412.

At act 1414, a salicide process is performed to form a silicide on tops of the first doped region and the second doped region. FIG. 12 illustrates a cross-sectional view 1200 of some embodiments corresponding to act 1414.

At act 1416, one or more interconnects are formed within an inter-level dielectric structure formed over a substrate. FIG. 13 illustrates a cross-sectional view 1300 of some embodiments corresponding to act 1416.

FIGS. 15-20 illustrate cross-sectional views 1500-2000 of some alternative embodiments of a method of forming an integrated chip comprising a semiconductor device disposed within a semiconductor material that is covered by a passivation layer. Although FIGS. 15-20 are described in relation to a method, it will be appreciated that the structures disclosed in FIGS. 15-20 are not limited to such a method, but instead may stand alone as structures independent of the method.

Figure 15:
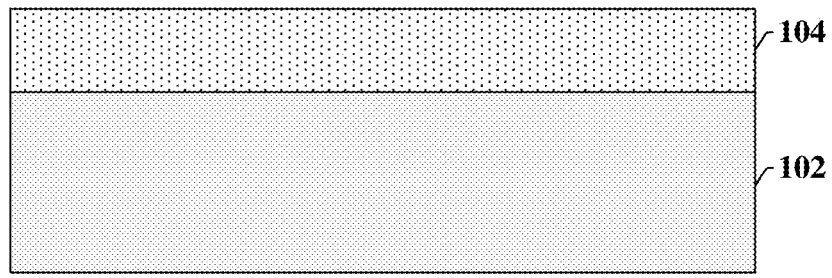
FIGS. 15-20 illustrate cross-sectional views of some alternative embodiments of a method of forming an integrated chip comprising a semiconductor device disposed within a semiconductor material that is covered by a passivation layer.

As shown in cross-sectional view 1500 of FIG. 15, a second semiconductor material 104 is formed on a substrate 102. In some embodiments, the substrate 102 may comprise or be a first semiconductor material. In some embodiments, the first semiconductor material may comprise or be silicon. In other embodiments, the first semiconductor material may be germanium, gallium, or the like. The second semiconductor material 104 is different than the first semiconductor material of the substrate 102. In some embodiments, the second semiconductor material 104 may comprise or be a group IV semiconductor, a group III-V compound semiconductor, or the like. For example, in some embodiments the second semiconductor material 104 may comprise or be Ge, SiGe, GeSn, SiC, or the like. In other embodiments, the second semiconductor material 104 may comprise or be GaAs, InP, GaN, InGaAs, InAlAs, GaSb, AlSb, AlAs, AlP, GaP, or the like. In some embodiments, the second semiconductor material 104 may be formed by way of an epitaxial growth process. For example, in various embodiments, the second semiconductor material 104 may be formed by a CVD process, a PE-CVD process, an ALD process, a PVD process, an MBE process, or the like.

Figure 16:
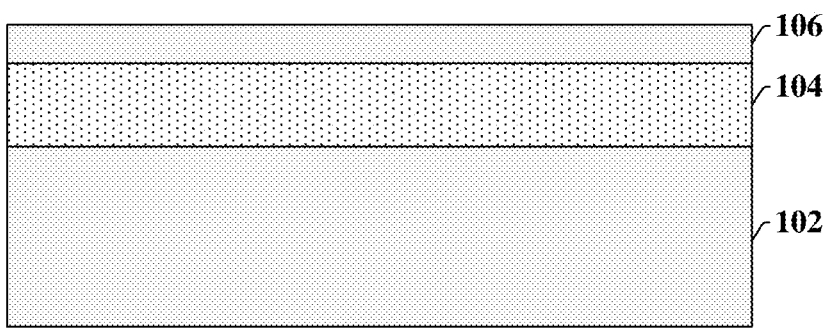

As shown in cross-sectional view 1600 of FIG. 16, a passivation layer 106 is formed onto the substrate 102 and the second semiconductor material 104. In some embodiments, the passivation layer 106 continuously extends between outermost sidewalls of the second semiconductor material 104. The passivation layer comprises or is a semiconductor material. In some embodiments, the passivation layer 106 may comprise or be the first semiconductor material. In various embodiments, the passivation layer 106 may comprise or be silicon, polysilicon, amorphous silicon, single crystal silicon, or the like.

Figure 17:
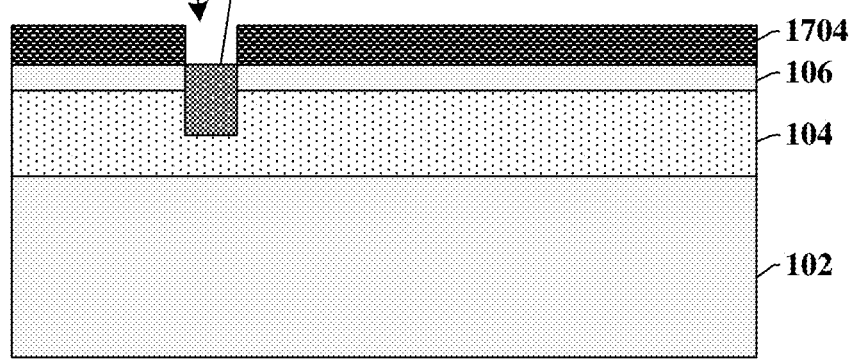

As shown in cross-sectional view 1700 of FIG. 17, a first implantation process is performed to form a first doped region 110 within both the passivation layer 106 and the second semiconductor material 104. In some embodiments, the first implantation process forms a first doped region 110 having a first doping type (e.g., n-type). In some embodiments, the first implantation process may be performed by implanting one or more first dopant species 1702 according to a first masking layer 1704 having a first opening 1706 over the second semiconductor material 104. In some embodiments, the one or more first dopant species 1702 may comprise one or more of boron, gallium, indium, or the like. In some embodiments, the first masking layer 1704 may comprise a photosensitive material (e.g., a photoresist).

Figure 18:
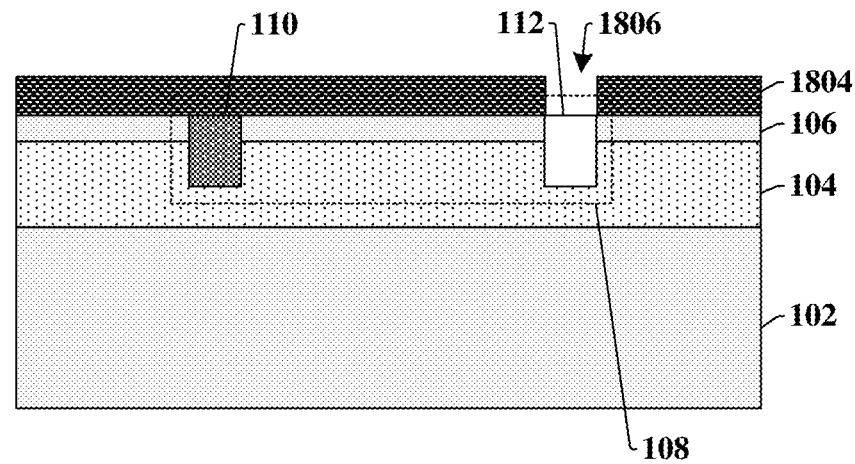

As shown in cross-sectional view 1800 of FIG. 18, a second implantation process is performed to form a second doped region 112 within both the passivation layer 106 and the second semiconductor material 104. In some embodiments, the second doped region 112 is laterally separated from the first doped region 110 by a non-zero distance extending through the second semiconductor material 104. In some embodiments the second implantation process forms a second doped region 112 having a second doping type (e.g., p-type). In some embodiments, the second implantation process may be performed by implanting one or more second dopant species 1802 according to a second masking layer 1804 having a second opening 1806 over the second semiconductor material 104. In some embodiments, the one or more second dopant species 1802 may comprise one or more of phosphorus, arsenic, or the like. In some embodiments, the second masking layer 1804 may comprise a photosensitive material (e.g., a photoresist).

Figure 19:
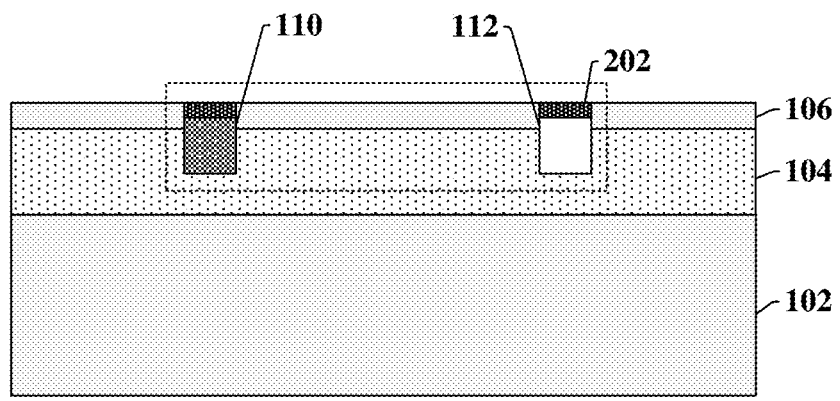

As shown in cross-sectional view 1900 of FIG. 19, a salicide process is performed to form a silicide 202 along tops of the first doped region 110 and the second doped region 112. In some embodiments, the salicide process may be performed by depositing a metal layer (e.g., a nickel layer) and then performing a thermal annealing process (e.g., a rapid thermal anneal) to form the silicide 202.

Figure 20:
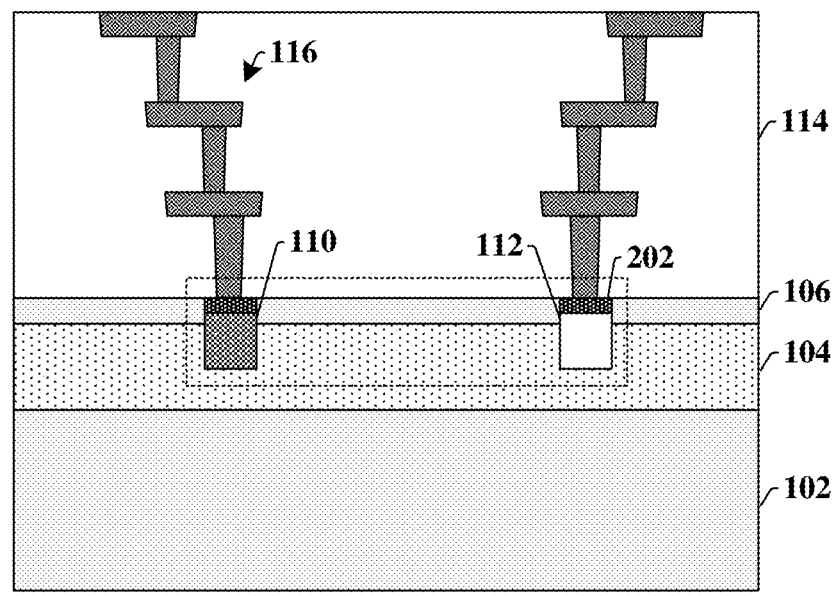

As shown in cross-sectional view 2000 of FIG. 20, one or more interconnects 116 may be formed within an inter-level dielectric (ILD) structure 114 formed over the substrate 102. In some embodiments, the ILD structure 114 may comprise a plurality of stacked ILD layers. In some embodiments, the one or more interconnects 116 may comprise one or more of a conductive contact, an interconnect wire, and/or an interconnect via.

Figure 21:
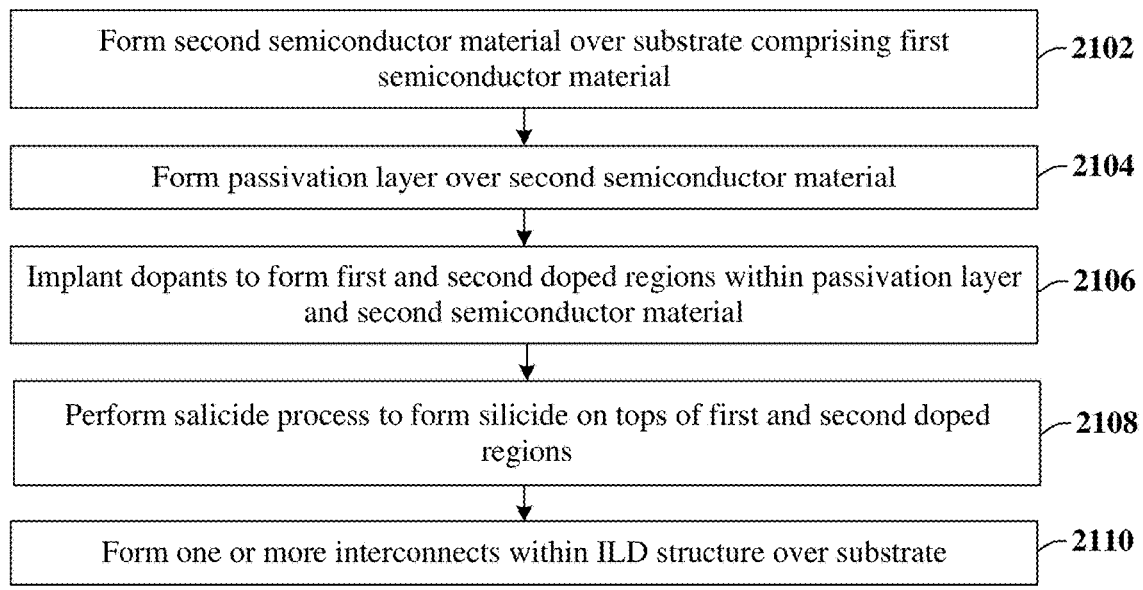
FIG. 21 illustrates a flow diagram of some alternative embodiments of a method of forming an integrated chip comprising a semiconductor device disposed within a semiconductor material that is covered by a passivation layer.

FIG. 21 illustrates a flow diagram of some embodiments of a method 2100 of forming an integrated chip comprising a semiconductor device disposed within a semiconductor material that is covered by a passivation layer.

At act 2102, a second semiconductor material is formed over a substrate comprising a first semiconductor material. FIG. 15 illustrates a cross-sectional view 1500 of some embodiments corresponding to act 2102.

At act 2104, a passivation layer is formed over the second semiconductor material. In some embodiments, the passivation layer may comprise or be the first semiconductor material. FIG. 16 illustrates a cross-sectional view 1600 of some embodiments corresponding to act 2104.

At act 2106, dopants are implanted to form first and second doped regions within the passivation layer and the second semiconductor material. In some embodiments, the first and second doped regions have different doping types. FIGS. 17-18 illustrate cross-sectional views, 1700 and 1800, of some embodiments corresponding to act 2106.

At act 2108, a salicide process is performed to form a silicide on tops of the first doped region and the second doped region. FIG. 19 illustrates a cross-sectional view 1900 of some embodiments corresponding to act 2108.

At act 2110, one or more interconnects are formed within an inter-level dielectric structure formed over a substrate. FIG. 20 illustrates a cross-sectional view 2000 of some embodiments corresponding to act 2110.

Accordingly, in some embodiments, the present disclosure relates to an integrated chip structure having a semiconductor device (e.g., a photonic device) disposed within a second semiconductor material arranged on a substrate comprising a first semiconductor material. A passivation layer is arranged on the second semiconductor material and is configured to reduce leakage currents along an upper surface of the second semiconductor material by passivating defects disposed along the upper surface of the second semiconductor material.

In some embodiments, the present disclosure relates to an integrated chip. The integrated chip includes a substrate having a first semiconductor material; a second semiconductor material disposed on the first semiconductor material, the second semiconductor material being a group IV semiconductor or a group III-V compound semiconductor; a passivation layer disposed on the second semiconductor material, the passivation layer including the first semiconductor material; and a first doped region and a second doped region extending through the passivation layer and into the second semiconductor material. In some embodiments, the first semiconductor material is silicon. In some embodiments, the first semiconductor material of the substrate vertically and laterally contacts the second semiconductor material. In some embodiments, the passivation layer contacts a topmost surface of the second semiconductor material. In some embodiments, the integrated chip further includes a silicide arranged within the passivation layer and along tops of the first doped region and the second doped region. In some embodiments, the first semiconductor material is silicon and the second semiconductor material is germanium. In some embodiments, the substrate has sidewalls and a horizontally extending surface that define a recess within the substrate; and the second semiconductor material is arranged within the recess. In some embodiments, the second semiconductor material has angled sidewalls that cause the second semiconductor material to have a first width that decreases as a first distance over the horizontally extending surface increases; and the passivation layer has angled sidewalls that cause the passivation layer to have a second width that increases as a second distance over the horizontally extending surface increases. In some embodiments, the first doped region has a first doping type and the second doped region has a second doping type that is different than the first doping type. In some embodiments, the first doped region and the second doped region are vertically separated from a bottom of the second semiconductor material by one or more non-zero distances.

In other embodiments, the present disclosure relates to an integrated chip. The integrated chip includes a substrate having silicon; a second semiconductor material having a bottommost surface contacting the silicon of the substrate, the second semiconductor material including a group IV semiconductor or a group III-V compound semiconductor; a passivation layer having silicon, the silicon of the passivation layer contacting an uppermost surface of the second semiconductor material; a first doped region having a first doping type and extending through the passivation layer and into the second semiconductor material; and a second doped region having a second doping type and extending through the passivation layer and into the second semiconductor material, the first doped region and the second doped region are separated from the bottommost surface of the second semiconductor material by the second semiconductor material. In some embodiments, the integrated chip further includes a plurality of interconnects disposed within an inter-level dielectric (ILD) structure over the substrate, the ILD structure extending along sidewalls of the passivation layer. In some embodiments, the first doped region and the second doped region define a photonic device. In some embodiments, the second semiconductor material has a different width than the passivation layer. In some embodiments, the passivation layer has sidewalls directly over the substrate. In some embodiments, the second semiconductor material continuously extends between the bottommost surface, which contacts the silicon of the substrate, and a topmost surface contacting the silicon of the passivation layer. In some embodiments, the substrate has a first upper surface directly below the passivation layer and a second upper surface laterally outside of the passivation layer, the second upper surface being recessed below the first upper surface. In some embodiments, the first doped region and the second doped region are laterally separated from an interface between sidewalls of the substrate and the second semiconductor material.

In other embodiments, the present disclosure relates to a method of forming an integrated chip. The method includes forming a second semiconductor material onto a substrate having a first semiconductor material; forming a passivation layer onto the second semiconductor material; performing a first implantation process to form a first doped region that has a first doping type and that extends through the passivation layer and into the second semiconductor material; and performing a second implantation process to form a second doped region that has a second doping type and that extends through the passivation layer and into the second semiconductor material. In some embodiments, the method further includes patterning the substrate to define a recess within the substrate; forming the second semiconductor material within the recess; performing a planarization process to remove excess of the second semiconductor material from over the substrate; and forming the passivation layer on and in contact with the substrate and the second semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
forming a second semiconductor material onto a substrate comprising a first semiconductor material, wherein the first semiconductor material is a different semiconductor material than the second semiconductor material;
forming a passivation layer onto the second semiconductor material;
performing a first implantation process to form a first doped region having a first doping type, the first doped region extending through the passivation layer and into the second semiconductor material; and
performing a second implantation process to form a second doped region having a second doping type, the second doped region extending through the passivation layer and into the second semiconductor material.

2. The method of claim 1, further comprising:
patterning the substrate to define a recess within the substrate;
forming the second semiconductor material within the recess;
performing a planarization process to remove excess of the second semiconductor material from over the substrate; and
forming the passivation layer on and in contact with the substrate and the second semiconductor material.

3. The method of claim 1, wherein the passivation layer and the first semiconductor material are a same material.

4. The method of claim 1, wherein the first semiconductor material both laterally and vertically contacts the second semiconductor material.

5. The method of claim 1, wherein the passivation layer contacts a topmost surface of the second semiconductor material.

6. The method of claim 1, further comprising:
forming a silicide along tops of the first doped region and the second doped region, the silicide being directly between sidewalls of the passivation layer.

7. The method of claim 1, wherein the first semiconductor material is silicon and the second semiconductor material comprises germanium.

8. The method of claim 1, wherein the first doped region and the second doped region are vertically separated from a bottom of the second semiconductor material by one or more non-zero distances.

9. A method of forming an integrated chip, comprising:
etching a substrate comprising a first semiconductor material to form a recess, the recess defined by sidewalls and a lower surface of the substrate;
forming a second semiconductor material within the recess;
performing a planarization process to remove the second semiconductor material from over the substrate;
forming a passivation layer onto both the first semiconductor material and the second semiconductor material; and
performing implantation processes to form first and second doped regions within the passivation layer and the second semiconductor material, the first and second doped regions having different doping types.

10. The method of claim 9, further comprising:
patterning the passivation layer to remove the passivation layer from laterally outside of the second semiconductor material.

11. The method of claim 10, wherein the passivation layer and the second semiconductor material have substantially equal widths after patterning the passivation layer.

12. The method of claim 9, wherein the passivation layer completely covers the second semiconductor material.

13. The method of claim 9, wherein the first and second doped regions respectively comprise an n-doped region and a p-doped region laterally separated by the second semiconductor material and the passivation layer.

14. The method of claim 9, wherein the passivation layer has a bottommost surface that is vertically above tops of both the substrate and the second semiconductor material.

15. The method of claim 9, wherein the passivation layer is silicon.

16. A method of forming an integrated chip, comprising:
forming a semiconductor material on a substrate;
forming a passivation layer onto the semiconductor material;
forming a first doped region having a first doping type in both the passivation layer and the semiconductor material;
forming a second doped region having a second doping type in both the passivation layer and the semiconductor material, wherein bottoms of the first doped region and the second doped region are vertically separated from the substrate by the semiconductor material; and forming a plurality of interconnects within an inter-level dielectric (ILD) structure formed over the passivation layer, the plurality of interconnects being coupled to the first doped region and the second doped region.

17. The method of claim 16, further comprising:
performing a salicide process to form a silicide from a part of the passivation layer that is directly over the first doped region, an interface between the silicide and a top of the first doped region being vertically between a top and a bottom of the passivation layer.

18. The method of claim 16, wherein the ILD structure is formed along sidewalls of the passivation layer.

19. The method of claim 16, wherein the semiconductor material has a different width than the passivation layer.

20. The method of claim 16, wherein the passivation layer has a flat bottom surface that is vertically below tops of the first doped region and the second doped region, the flat bottom surface continuously extending between the first doped region and the second doped region.

\* \* \* \* \*